(12) United States Patent
Chuang et al.

(10) Patent No.: US 9,059,310 B2
(45) Date of Patent: Jun. 16, 2015

(54) SRAM DEVICES UTILIZING STRAINED-CHANNEL TRANSISTORS AND METHODS OF MANUFACTURE

(71) Applicant: Taiwan Semiconductor Manufacturing Company, Ltd., Hsin-Chu (TW)

(72) Inventors: Harry-Hak-Lay Chuang, Singapore (SG); Hung-Chih Tsai, Dalliao (TW); Kong-Beng Thei, Hsin-Chu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/102,289

(22) Filed: Dec. 10, 2013

(65) Prior Publication Data

US 2014/0099758 A1    Apr. 10, 2014

Related U.S. Application Data

(63) Continuation of application No. 12/052,389, filed on Mar. 20, 2008, now Pat. No. 8,624,295.

(51) Int. Cl.
*H01L 21/8238* (2006.01)
*H01L 27/11* (2006.01)

(52) U.S. Cl.
CPC .... *H01L 21/8238* (2013.01); *H01L 21/823864* (2013.01); *H01L 27/11* (2013.01); *H01L 27/1104* (2013.01)

(58) Field of Classification Search
CPC .............. H01L 21/8238; H01L 21/823864
See application file for complete search history.

(56) References Cited

U.S. PATENT DOCUMENTS

| 6,054,343 | A | 4/2000 | Ashburn |
| 6,960,781 | B2 | 11/2005 | Currie et al. |
| 2002/0039464 | A1 | 4/2002 | Yoshimura et al. |
| 2005/0202603 | A1 | 9/2005 | Sayama et al. |
| 2005/0252443 | A1 | 11/2005 | Tsai et al. |
| 2006/0081875 | A1 | 4/2006 | Lin et al. |
| 2006/0138398 | A1 | 6/2006 | Shimamune et al. |
| 2008/0116487 | A1* | 5/2008 | Lee et al. ...................... 257/194 |
| 2008/0197412 | A1 | 8/2008 | Zhang et al. |
| 2008/0283906 | A1 | 11/2008 | Bohr |
| 2009/0039388 | A1* | 2/2009 | Teo et al. ...................... 257/190 |

* cited by examiner

*Primary Examiner* — Shaun Campbell
*Assistant Examiner* — Raj R Gupta
(74) *Attorney, Agent, or Firm* — Slater & Matsil, L.L.P (57) ABSTRACT

A novel SRAM memory cell structure and method of making the same are provided. The SRAM memory cell structure comprises strained PMOS transistors formed in a semiconductor substrate. The PMOS transistors comprise epitaxial grown source/drain regions that result in significant PMOS transistor drive current increase. An insulation layer is formed atop an STI that is used to electrically isolate adjacent PMOS transistors. The insulation layer is substantially elevated from the semiconductor substrate surface. The elevated insulation layer facilitates the formation of desirable thick epitaxial source/drain regions, and prevents the bridging between adjacent epitaxial layers due to the epitaxial layer lateral extension during the process of growing epitaxial sour/drain regions. The processing steps of forming the elevated insulation layer are compatible with a conventional CMOS process flow.

20 Claims, 11 Drawing Sheets

SRAM DEVICES UTILIZING STRAINED-CHANNEL TRANSISTORS AND METHODS OF MANUFACTURE

This application is a continuation of, and claims the benefit of, U.S. patent application Ser. No. 12/052,389, filed on Mar. 20, 2008, titled "SRAM Devices Utilizing Strained-Channel Transistors and Methods of Manufacture", which application is hereby incorporated herein by reference.

TECHNICAL FIELD

The present invention relates generally to semiconductor devices and more particularly to SRAM devices and SRAM cell structures that utilize strained-channel transistors to enhance the performance of transistors and methods of manufacturing the same.

BACKGROUND

While the trend of integrating complex electronic systems in an integrated circuit (IC) continues, there is an increasing demand for high-performance memory devices for storing software programs and processed data. As a reliable, proven technology, a Static Random Access Memory (SRAM) is the instinctive choice of a high-performance stand-alone memory device or an embedded memory device used in ICs having a system-on-a-chip (SOC) configuration. The distinct advantages of an SRAM include fast access speed, low power consumption, high noise margin, and process compatibility with a conventional CMOS fabrication process, among others. There is a continuous quest for SRAMs with higher storage cell density so that a larger amount of data can be stored.

Figure 1A:
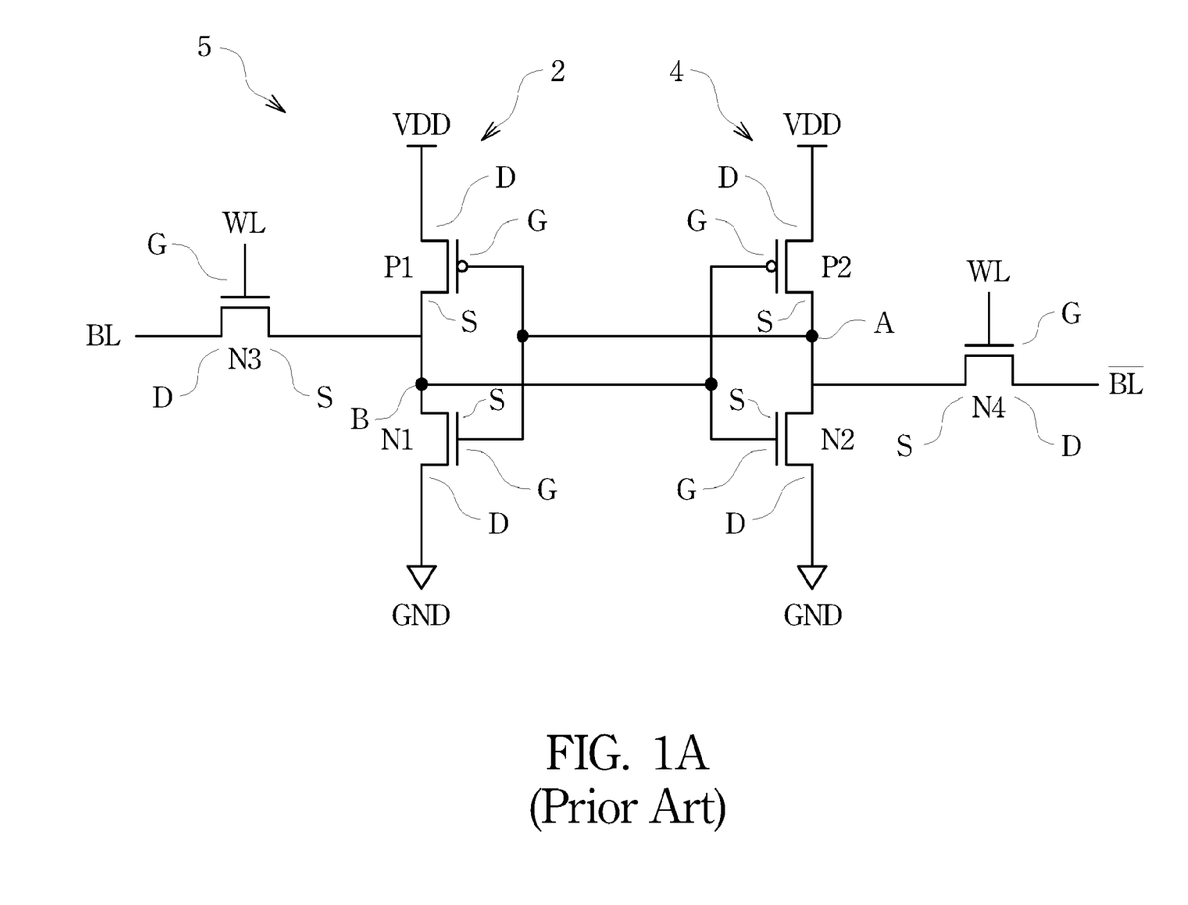
FIG. 1A is a schematic view of a prior art SRAM cell.

FIG. 1A shows a schematic diagram of a conventional six transistor CMOS SRAM cell 5. In SRAM cell 5, a first inverter 2, comprising a first pull-up PMOS transistor P1 and a first pull-down NMOS transistor N1, is cross-coupled with a second inverter 4, comprising a second pull-up PMOS transistor P2 and a second pull-down NMOS transistor N2. The source, drain and gate of each transistor are labeled with an "S," "D," or "G," respectively. The gate electrodes of P1 and N1 and the source regions of P2 and N2 make up a first storage node "A." The gate electrodes of P2 and N2 and the source regions of P1 and N1 make up a second storage node "B." The drains of P1 and P2 and the drains of N1 and N2 are coupled to a supply voltage VDD and ground GND, respectively.

During operation, data is written into the SRAM cell 5 by first activating the wordline WL coupled to access NMOS transistors N3 and N4. Subsequently, the digital bit carried on the bitline BL will be passed to the storage node "B" and the complementary bit on the bitline BL will be passed to the storage node "A." This state will be held until new data is applied on the access transistors N3 and N4.

Due to the inherently lower carrier mobility of holes than that of electrons, a PMOS transistor in an SRAM cell is typically formed occupying larger silicon surface than that of an NMOS transistor in order to obtain matching drive currents between an NMOS and a PMOS transistor, generally leading to the desired symmetric device electrical characteristics. This situation may slow down the pace of continuously scaling-down device feature sizes and increasing memory cell density in an SRAM.

Figure 1B:
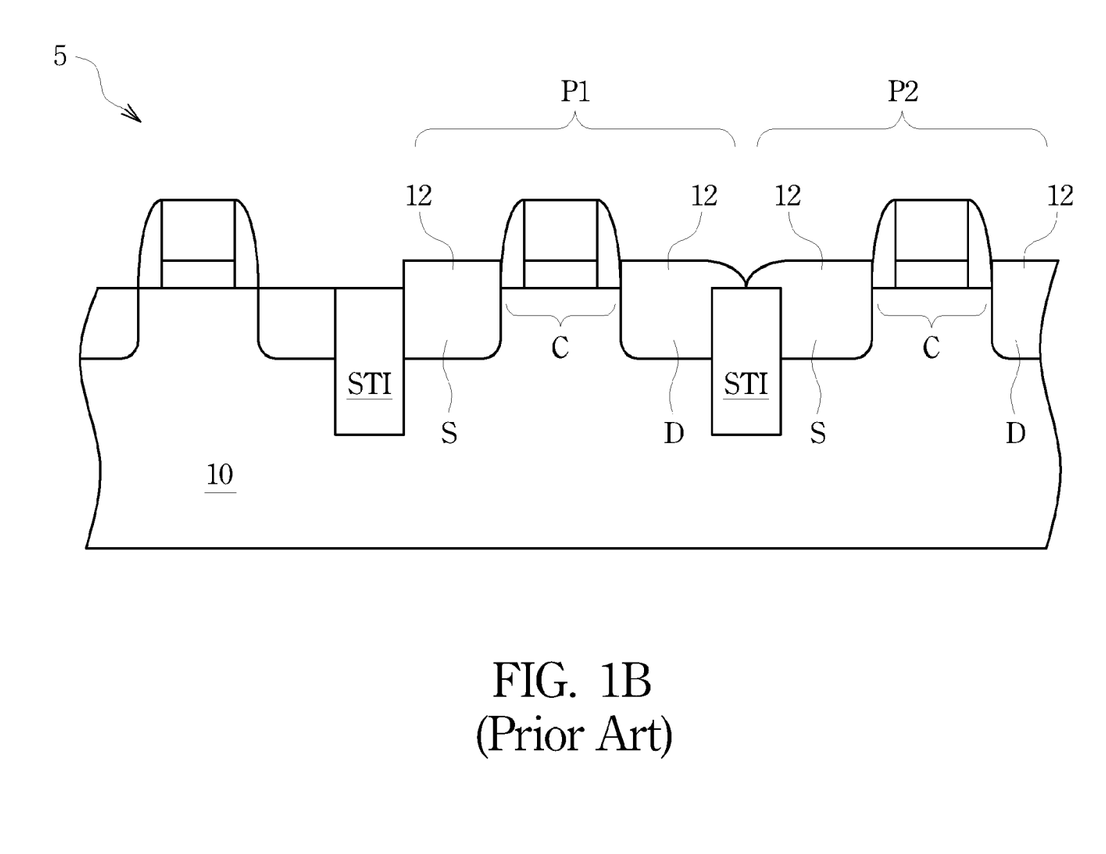
FIG. 1B shows a portion of a cross sectional view of a prior art SRAM cell.

FIG. 1B illustrates a portion of the cross sectional view of CMOS SRAM cell 5, where strain engineering is employed to enhance PMOS transistors P1 and P2 performance in SRAM cell 5. This is accomplished by etching a recess into silicon substrate 10 at the source/drain regions of P1 and P2. Relaxed silicon germanium (SiGe) epitaxial layer 12 is then selectively grown in the source region "S" and drain region "D" of P1 and P2. Because the lattice constant of the SiGe is greater than that of silicon, the channel regions "C" between the SiGe source/drains of P1 and P2 are placed under compressive stresses, leading to a significant drive current increase for P1 and P2. However, due to the lateral extension of SiGe epitaxial layer 12 during the epitaxial growth process, SiGe from drain region "D" of P1 and SiGe from source region "S" of P2 may bridge a shallow trench isolation (STI) isolating P1 and P2, thereby electrically shorting drain region "D" of P1 and source region "S" of P2. This problem prevents forming thick SiGe epitaxial layer that typically provides favorable electrical characteristics, such as reduced contact resistance. This problem may also lead to reduced SRAM cell manufacturing yield.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely improved SRAM devices and SRAM cell structures, and a method of forming the same. This inventive SRAM cell structure comprises an elevated insulation layer on a device isolation region between adjacent PMOS source/drain regions that comprise an elevated epitaxial SiGe layer. The integration of an elevated insulation layer on the device isolation region may be fabricated adding few processing steps that are compatible with a conventional CMOS process flow, for example. The process steps used to form the insulation region will lead to improved overall SRAM product yield.

Figure 2:
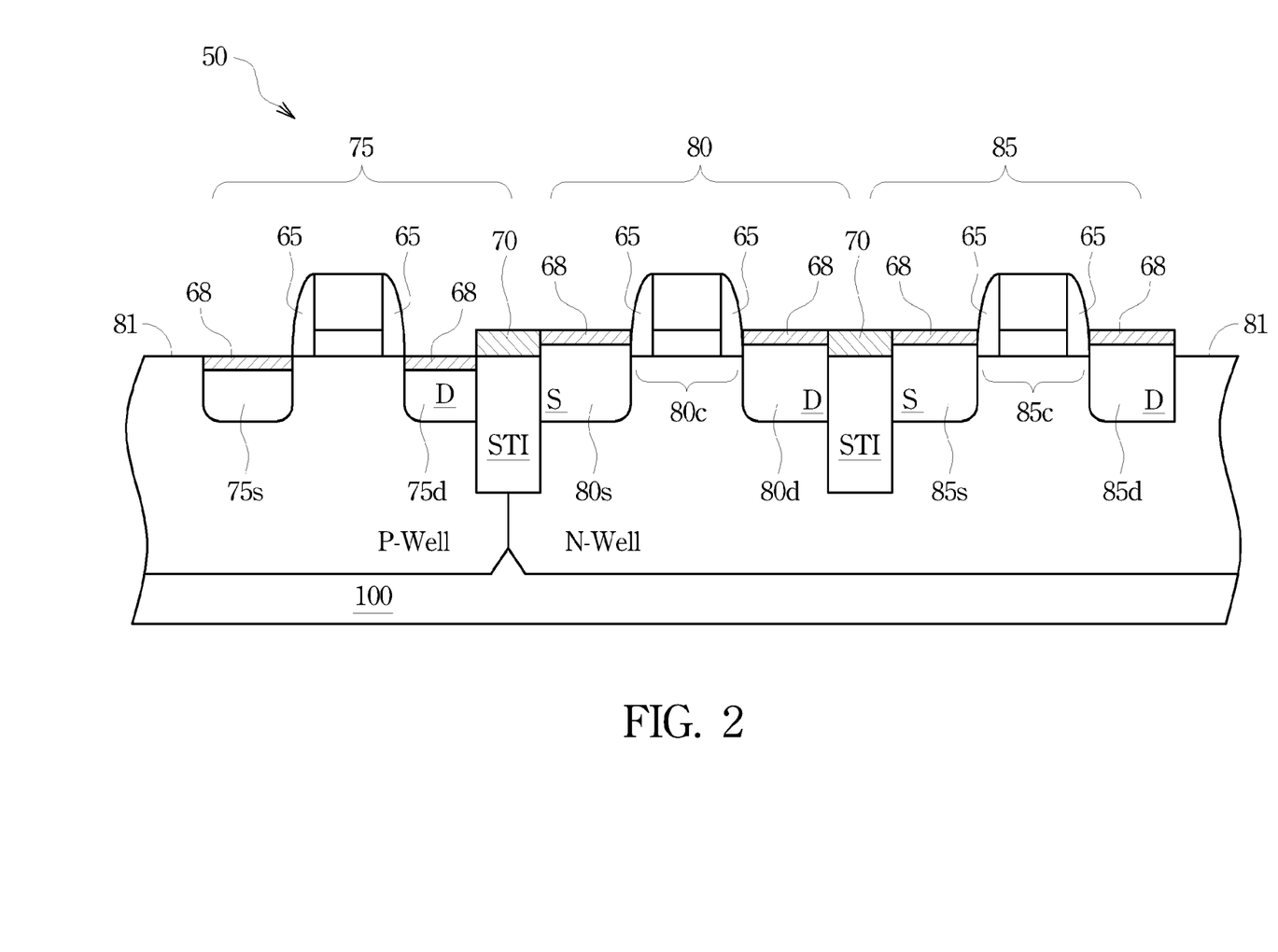
FIG. 2 shows a portion of an SRAM cell in accordance with a preferred embodiment of the present invention.

Referring to FIG. 2, a portion of a CMOS SRAM cell 50 in accordance with a preferred embodiment of the present invention is illustrated. The portion of cell 50 comprises PMOS transistors 80 and 85, such as pull-up PMOS transistors P1 and P2 of FIG. 1A, formed in an N-type region (e.g., N-well) of substrate 100. The portion of the SRAM cell 50 also comprises NMOS device 75, such as pull-down NMOS transistor N1 or N2 of FIG. 1A, formed in a P-type region (e.g., P-well) of substrate 100. Substrate 100 is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like. Alternatively, substrate 100 could be a semiconductor layer formed on an insulating layer, in a so-called silicon-on-insulator (SOI) wafer configuration.

PMOS transistors 80 and 85 each comprise a source region 80s and 85s, and a drain region 80d and 85d, respectively. Source regions 80s and 85s and drain regions 80d and 85d are SiGe epitaxial layers formed in substrate 100 and are elevated from top surface 81 of substrate 100. Source/drain regions 80s, 80d, 85s, and 85d extend from an edge of gate electrode spacer 65 to an edge of STI. In a preferred embodiment, source/drain regions 80s, 80d, 85s, and 85d are from about 50 Å to about 500 Å elevated from top surface 81 of substrate 100. Because the lattice constant of SiGe source/drain regions 80s, 80d, 85s, and 85d is greater than that of silicon substrate 100, channel regions 80c and 85c between the SiGe source/drains 80s and 80d, 85s and 85d, respectively, are placed under uniaxial compressive strain, which results in improved hole mobility in channel regions 80c and 85c. This may lead to a significant improvement in measured PMOS drive current. In one preferred embodiment, source/drains regions 80s, 80d, 85s and 85d each have a substantially constant Ge concentration, respectively, such as a substantially constant Ge concentration from about 5% to about 40%. In another preferred embodiment, Ge concentrations in source/drains regions 80s, 80d, 85s and 85d is graded from about 0% Ge at the top surface to a maximum concentration of about 30% near the source and drain bottom/substrate 100 interface. Also illustrated in FIG. 2, NMOS device 75 comprises heavily-doped N-type source region 75s and drain region 75d that extend into substrate 100, whereas source/drain regions 75s and 75d are not substantially elevated from top surface 81 of substrate 100.

SRAM cell 50 further comprises an insulation layer 70 that is formed atop the STIs. The STIs provide electrical isolation between like kinds of NMOS or PMOS transistors in a given well or substrate, such as PMOS transistors 80 and 85, and also provide electrical isolation between adjacent NMOS and PMOS transistors formed in separate wells, such as NMOS transistor 75 and PMOS transistor 80. Insulation layer 70 may be silicon nitride, but may also be made of oxynitride, silicon oxide, SiC, SiCN, any combinations thereof, or the like.

In one preferred embodiment, insulation layer 70 is formed prior to the formation of source/drain regions 80s, 80d, 85s, and 85d. The edges of insulation layer 70 are substantially aligned with the edges of STIs. Insulation layer 70 acts as a barrier to the lateral extension of the SiGe epitaxial layer when forming source/drain regions 80s, 80d, 85s, and 85d in a subsequent SiGe epitaxial growth process. The thickness of insulation layer 70 is, thus, about the same as that of the elevated portion of source/drain regions 80s and 80d, 85s and 85d to be formed. In a preferred embodiment, insulation layer 70 has a thickness of from about 50 Å to about 300 Å, while source/drain regions 80s, 80d, 85s, and 85d of PMOS transistors 80 and 85 have an elevated portion of from about 50 Å to about 300 Å above a top surface 81 of substrate 100. In another embodiment, source/drain regions 80s, 80d, 85s, and 85d of PMOS transistors 80 and 85 have an elevated portion of from about 150 Å to about 400 Å above a top surface 81 of substrate 100, leading to significantly reduced contact resistance due to the substantially thickened PMOS source and drain regions.

In preferred embodiments, the elevated portion of the epitaxial SiGe source/drain regions 80s, 80d, 85s, and 85d abut, at one end, an edge of gate electrode spacer 65 and abut, at another end, an edge of insulation layer 70, respectively. Furthermore, the insulating characteristic of insulation layer 70 reinforces the desired electrical isolation between adjacent NMOS and PMOS transistors. In preferred embodiments, SRAM cells also comprise silicide layer 68 that is formed on the top surfaces of NMOS and PMOS source/drain regions 75s, 75d, 80s, 80d, 85s, and 85d. Silicide layer 68 is preferably $NiSi_2$, $CoSi_2$, $WSi_2$, $TiSi_2$, or the like. Silicide layer 68 further reduces the contact resistances of the source/drain regions, thus improving NMOS and PMOS transistor performance.

Figure 3:
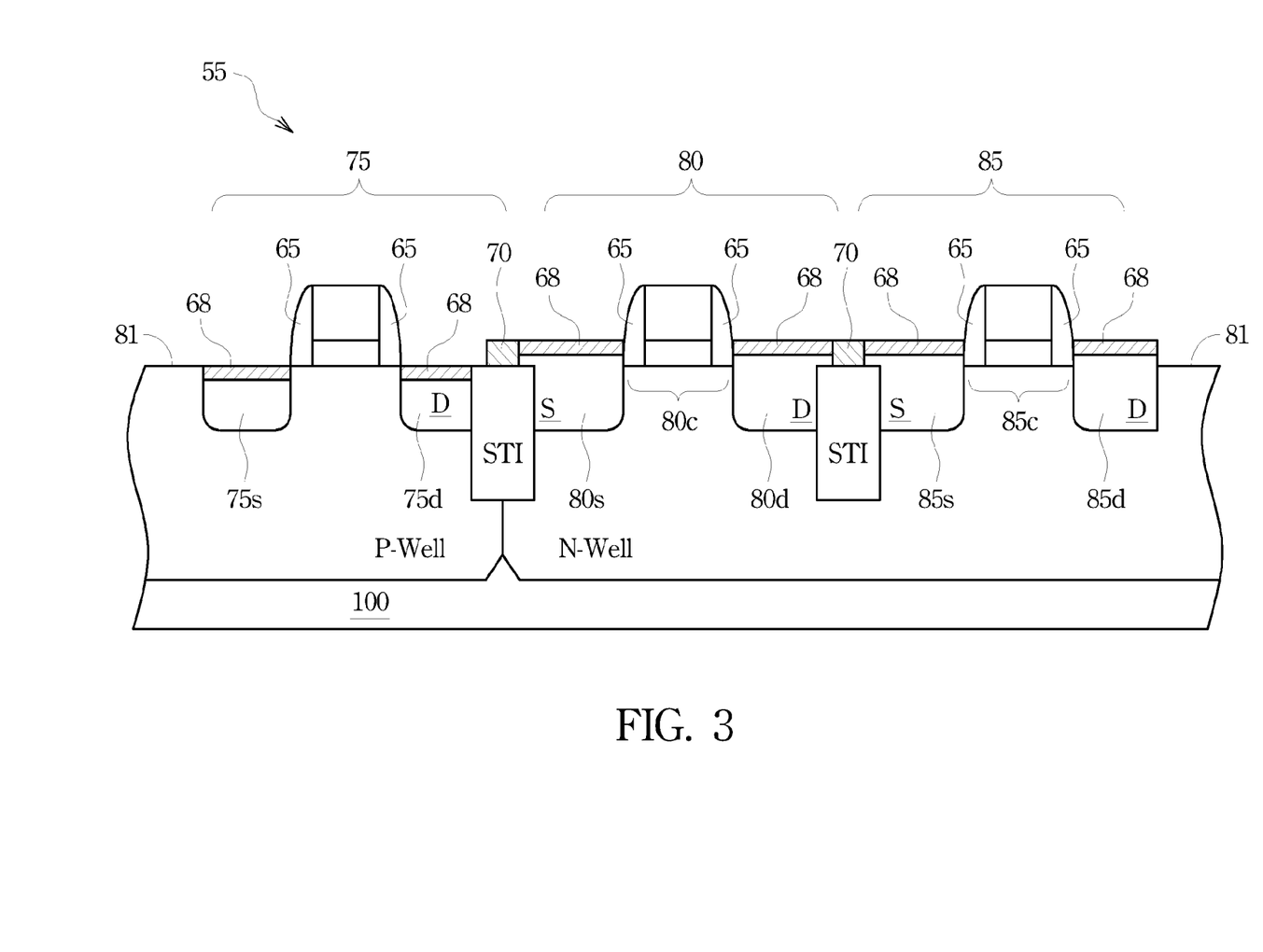
FIG. 3 shows a portion of an SRAM cell in accordance with a preferred embodiment of the present invention.

In another preferred embodiment, as illustrated in FIG. 3, the edges of insulation layer 70 are offset inwardly from the edges of STIs, enabling an increased contact area of the PMOS source/drain regions. Advantageous features include further reduced contact resistance and increased process margin of making electrical contact to the PMOS source/drain regions. To clarify description and avoid repetition, like numerals and letters used to describe SRAM cell 50 in FIG. 2 are used for the various elements in FIG. 3 and in the coming figures. Also, reference numerals described in FIG. 2 may not be described again in detail herein.

Figure 4:
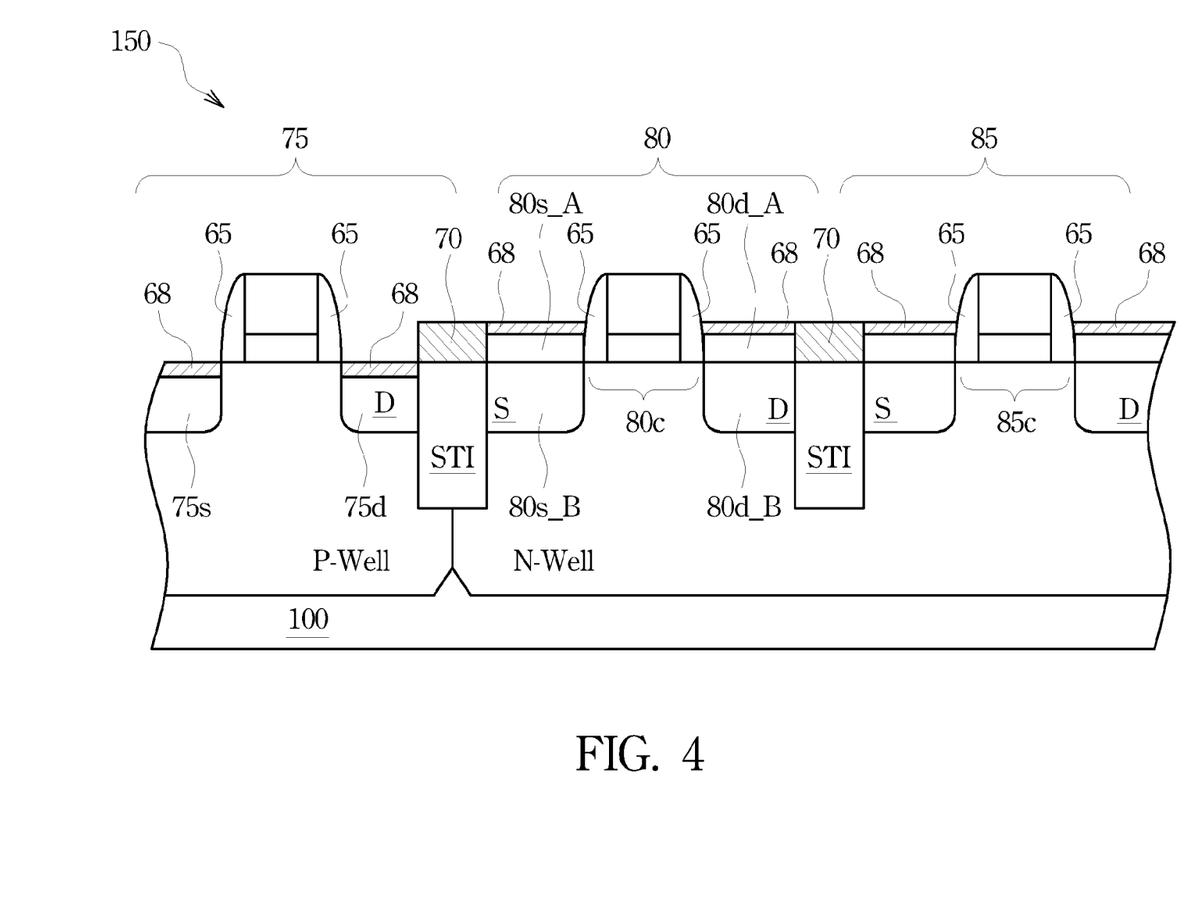
FIG. 4 shows a portion of an SRAM cell in accordance with a preferred embodiment of the present invention.

FIG. 4 shows a portion of SRAM cell 150 in accordance with another preferred embodiment of the present invention. Each of the epitaxial SiGe source/drain regions of PMOS devices, such as PMOS transistors 80 and 85, in SRAM cell 150 comprises a bottom layer and a cap layer overlying the bottom layer. As an example, bottom layer 80s_B and cap layer 80s_A of the source region of PMOS transistor 80 are used to illustrate inventive features of the current embodiment. The Ge in bottom layer 80s_B has a relatively high Ge concentration, while the Ge in cap layer 80s_A has a relatively low Ge concentration. In one preferred embodiment, the bottom layer and the cap layer each have a substantially constant Ge concentration, respectively, such as 20% Ge in bottom layer 80s_B and 5% Ge in cap layer 80s_A. In another preferred embodiment, Ge concentrations in cap layer 80s_A and bottom layer 80s_B is graded from about 0% Ge at the top surface of cap layer 80s_A to a maximum concentration of about 40% near bottom layer 80s_B/substrate 100 interface. In a further preferred embodiment, cap layer 80s_A has a substantially constant, low Ge concentration of from about 0% to about 5%, while Ge concentration in bottom layer 80s_B is graded reaching a maximum concentration of about 40% near bottom layer 80s_B/substrate 100 interface. Also, the thickness of cap layer 80s_A, either with constant or graded Ge concentration, is about 300 Å. The overall SiGe layer thickness of bottom layer 80s_B and cap layer 80s_A is of from about 400 Å to about 1000 Å.

By providing epitaxial SiGe source/drain regions having a high Ge concentration bottom layer and a low Ge concentration cap layer, the performance of the PMOS device in an SRAM cell can be further improved. In one aspect, bottom layers having a high Ge concentration in the source and drain regions of PMOS transistors in an SRAM cell, such as bottom layers 80s_B and 80d_B of PMOS transistor 80, create an increased uniaxial compressive strain in the channel regions, which may result in an increased PMOS transistor drive current. In another aspect, SiGe source/drain cap layers having a low Ge concentration, such as 80s_A and 80d_A of PMOS transistor 80, can lead to a high quality interface between the source/drain regions and silicide layer 68 formed from thereon because silicide layer 68 has a substantially matching lattice constant with Si but not with Ge. A good source/drain and silicide layer 68 interface can lead to reduced contact resistances to the source/drain regions of NMOS and PMOS transistors, thus improving NMOS and PMOS transistor performance.

PMOS transistors having an epitaxial SiGe source and drain region upgrade the electrical strength by increasing the hole mobility through their channel regions. This upgrade of PMOS transistors in an SRAM cell can be used to reduce the size of an SRAM cell because a pre-determined PMOS drive current can be achieved by a strained PMOS transistor having a reduced device size when compared with a non-strained PMOS transistor.

Figure 5:
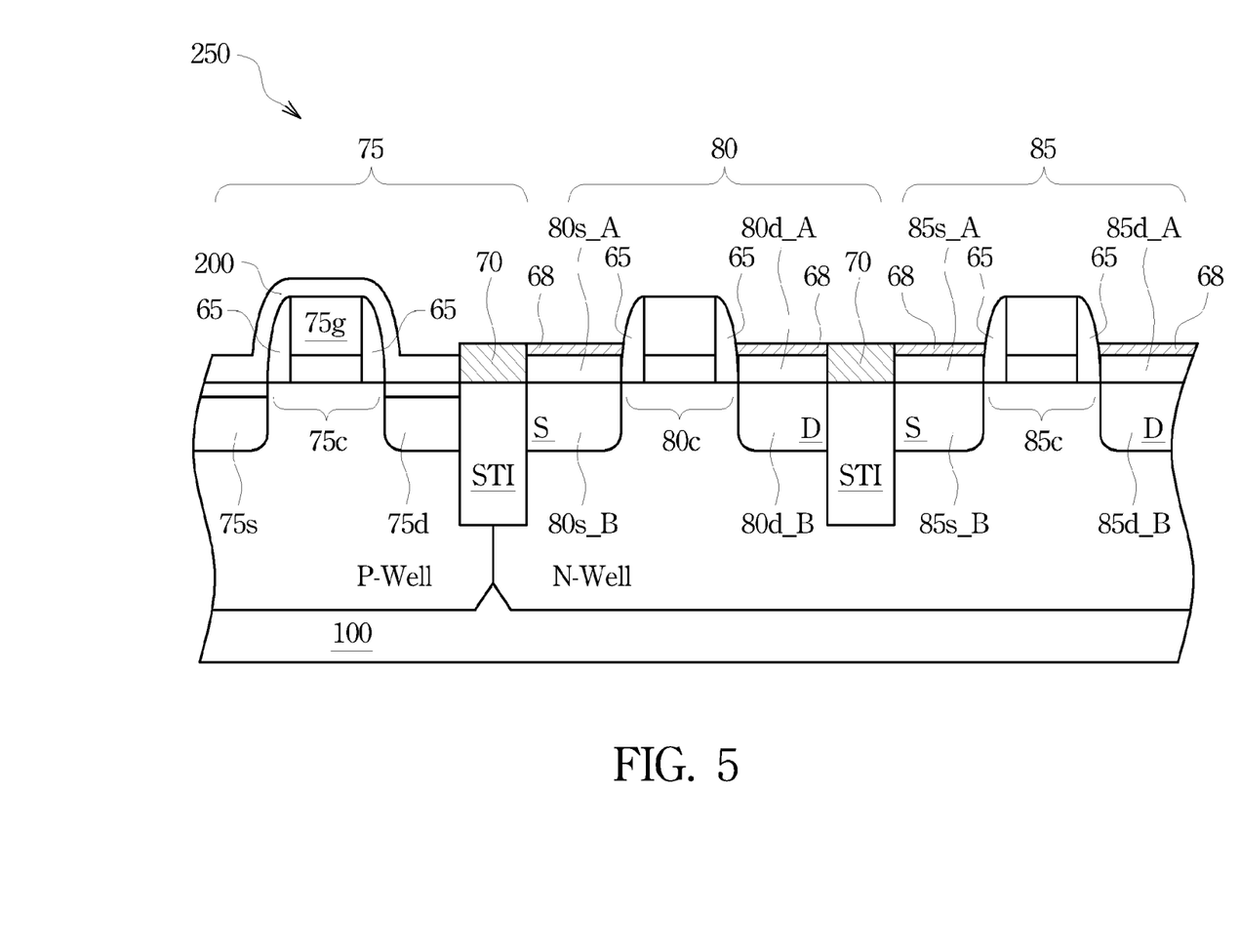
FIG. 5 shows a portion of an SRAM cell in accordance with a preferred embodiment of the present invention.

FIG. 5 illustrates a portion of SRAM cell 250 in accordance with another preferred embodiment of the present invention. Besides epitaxial SiGe source and drain regions of PMOS transistors 80, 85, and insulation layer 70, SRAM cell 250 further comprises tensile-stressed film 200 that is formed on the gate regions and at least a portion of the source regions and drain regions of the NMOS transistors in an SRAM cell, such as 75g, 75s and 75d of NMOS transistor 75. Tensile-stressed film 200 is preferably formed of a dielectric material, such as silicon nitride, oxynitride, oxide, or the like. In alternative embodiments, tensile-stressed film 200 may also comprise semiconductors, metals, combinations thereof, or the like. Tensile-stressed film 200 may be in the form of a single layer or composite layers. An advantageous feature of tensile-stressed film 200 is that it has an inherent stress, when deposited on an NMOS transistor, and induces a tensile strain in the channel region of the NMOS transistor, such as channel region 75c of NMOS device 75. The magnitude of the tensile strain is affected by the relative properties of the tensile-stressed film 200 and the underlying materials. In preferred embodiments, tensile-stressed film 200 is made of silicon nitride and has a thickness from about 50 Å to about 1000 Å. As known to those skilled in the art, a tensile strain in the channel region of an NMOS transistor enhances the electron mobility, thus leading to a significant improvement in measured NMOS drive current. This upgrade of NMOS transistors in an SRAM cell can be used to reduce the size of an SRAM cell because a pre-determined NMOS drive current can be achieved by a strained NMOS transistor having a reduced device size when compared with a non-strained NMOS transistor.

The formation of tensile-stressed film 200 on NMOS transistors in SRAM cell 250 also serves an important role in maintaining a pre-determined SRAM cell static noise margin (SNM) when PMOS transistors in an SRAM cell are upgraded with increased drive current in preferred embodiments of the current invention as described earlier.

As known in the art, Signal/Noise Margin (SNM) is a principle factor in evaluating the operational stability of an SRAM memory cell. SNM measures the SRAM cell logical stability when a voltage disturbance in the bit lines of an SRAM device occurs. Typically, SNM is maximized to ensure cell stability in a memory device. In order for a CMOS SRAM cell to work in a steady-state with a wide noise margin, the drive current of the pull-down NMOS transistors in an SRAM cell, such as N1 and N2 of FIG. 1A, is preferably equal to the drive current of the pull-up PMOS transistors in the SRAM cell, such as P1 and P2 of FIG. 1A. As PMOS transistor properties change, as in the case of forming SiGe source and drain regions in a PMOS transistor to create compressive strain in its channel region, thus, increasing the drive current in the PMOS transistor, the PMOS and NMOS transistor drive current ratio also changes. The change requires a drive current increase in the NMOS transistors to retain the initial, optimized NMOS and PMOS transistor drive current ratio. One way to enhance the drive current of the pull-down NMOS transistors in an SRAM cell is to increase its size, which is typically unfavorable because increasing SRAM memory cell density is generally preferred in advanced technology. Alternatively, by forming tensile-stressed film 200 on NMOS transistors in SRAM cell 250, the size of the pull-down NMOS transistors in an SRAM cell needs not to be increased while being able to maintain a pre-determined, robust SNM in the SRAM memory cell.

In an additional and/or alternative embodiment of the current invention, the size of the NMOS and PMOS transistors in an SRAM cell may be decreased or minimized in order to further reduce the size of an SRAM cell and, thus, achieve a maximum possible memory cell density. In this regard, the drive current of the pull-up PMOS transistors may be maintained to a pre-determined value by forming SiGe source and drain regions as described previously. A matching drive current in the pull-down NMOS transistors, which have a reduced transistor size, may be obtained by forming tensile-stressed film on the pull-down NMOS transistors in an SRAM memory cell. Accordingly, a pre-determined high SNM property can be retained even if transistor feature sizes in an SRAM memory cell are further reduced. In preferred embodiments, the level of stress, the film thickness, the film dimension, and the like of film 200 are adjusted to achieve a matching drive current in the pull-down NMOS transistors in an SRAM memory cell.

It should be noted that only a limited number of examples, such as SRAM cell 50, 55, 150, and 250 are shown for conveying the inventive feature of providing insulation layer 70 atop isolations, such as STIs, LOCOS (Local Oxidation of Silicon) isolations, or the like, thus enabling a significantly thickened PMOS transistor source and drain regions that create a desired strain in the PMOS transistor channel region. Also only a portion of each of the SRAM cells of 50, 55, 150, and 250 is illustrated for the ease of illustration and clarity. However, those of ordinary skill in the art will appreciate that this inventive feature can be used in integrated circuit devices other than SRAM memory cell where improved performance on PMOS devices is desired, such as increased drive current and reduced contact resistance, among others.

Furthermore, as known in the art, a strain NMOS transistor can also be formed in a manner where an epitaxial layer of Si source and drain is formed on a SiGe substrate. Because the lattice contact of Si is substantially smaller than that of SiGe, the channel region of an NMOS transistor thus formed is placed under a constant tensile strain, which results in improved electron mobility in the channel region. This may lead to a significant improvement in measured NMOS drive current. As can be appreciated by those skilled, the inventive features of forming insulation layer 70 atop isolations between PMOS transistors as described above can be readily used to form insulation layer atop isolations between NMOS transistors, thus leading to improved NMOS transistor performance.

In addition, the strain inducing materials and the various transistor configurations shown in the different embodiments may be changed, substituted, and combined without departing from the spirit and scope of the invention. The specific devices or lack of devices that are illustrated in the above examples are not intended to limit the embodiments of the present invention in any way.

Figure 6:
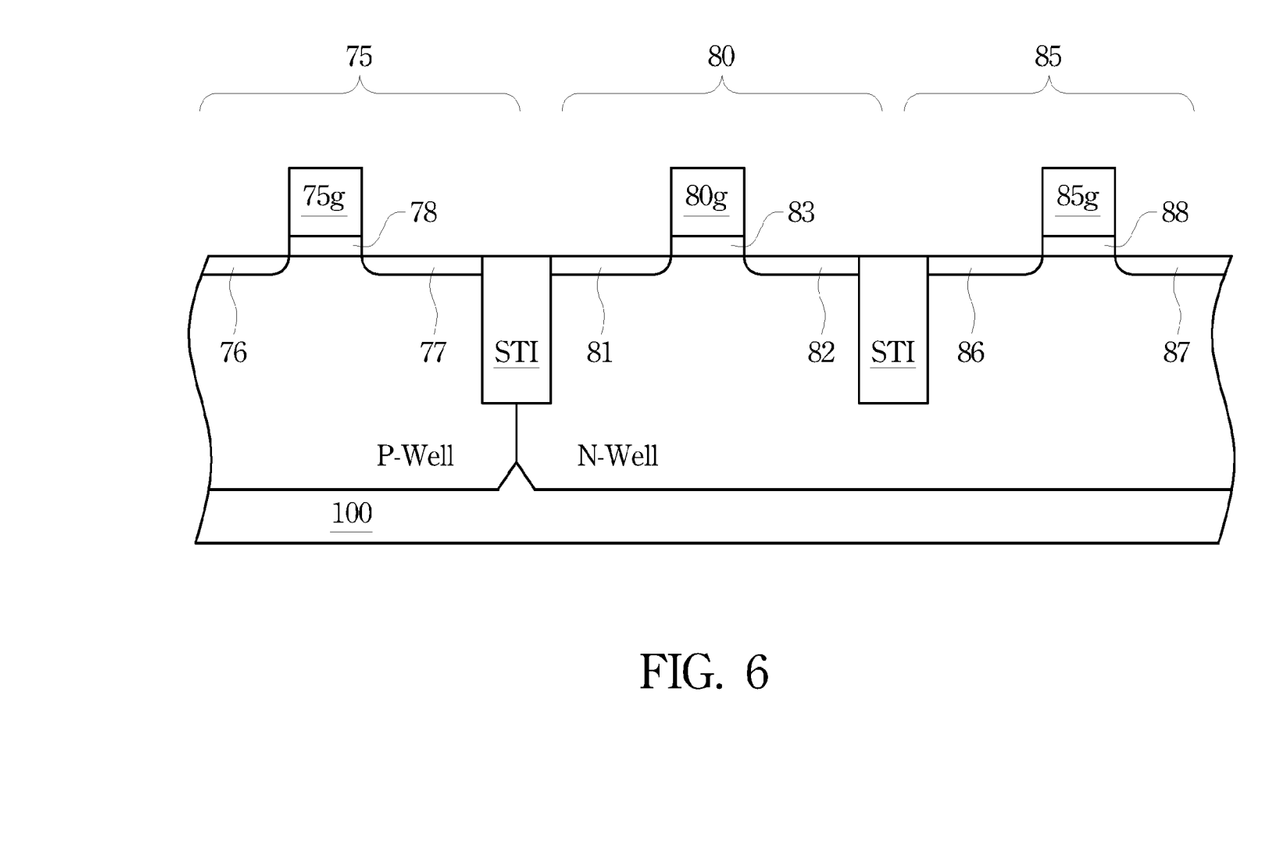
FIGS. 6-10 show cross sectional views of a portion of a preferred embodiment SRAM memory cell structure through various processing steps.

FIGS. 6-10 illustrate an exemplary embodiment of a process for fabricating a cell of an SRAM in preferred embodiments, such as cell 50 of FIG. 2 or cell 150 of FIG. 4. Referring to FIG. 6, the process comprises fabricating PMOS transistors 80 and 85 in and on an N-type region, such as an N-well of substrate 100, and fabricating NMOS transistor 75 in and on a P-type region, such as P-well of substrate 100. PMOS transistor 80 may include lightly doped source region 81, lightly doped drain region 82, and gate electrode 80g formed atop a gate dielectric layer 83. PMOS transistor 85 may include lightly doped source region 86, lightly doped drain region 87, and gate electrode 85g formed atop a gate dielectric layer 88. NMOS transistor 75 may include lightly doped source region 76, lightly doped drain region 77, and gate electrode 75g formed atop a gate dielectric layer 78. PMOS transistors 80, 85, and NMOS transistor 75 are electrically isolated from each other by known field isolations, such as STIs. Any known, suitable materials and methods of fabricating the NMOS transistor, PMOS transistor, and STIs may be utilized.

Figure 7:
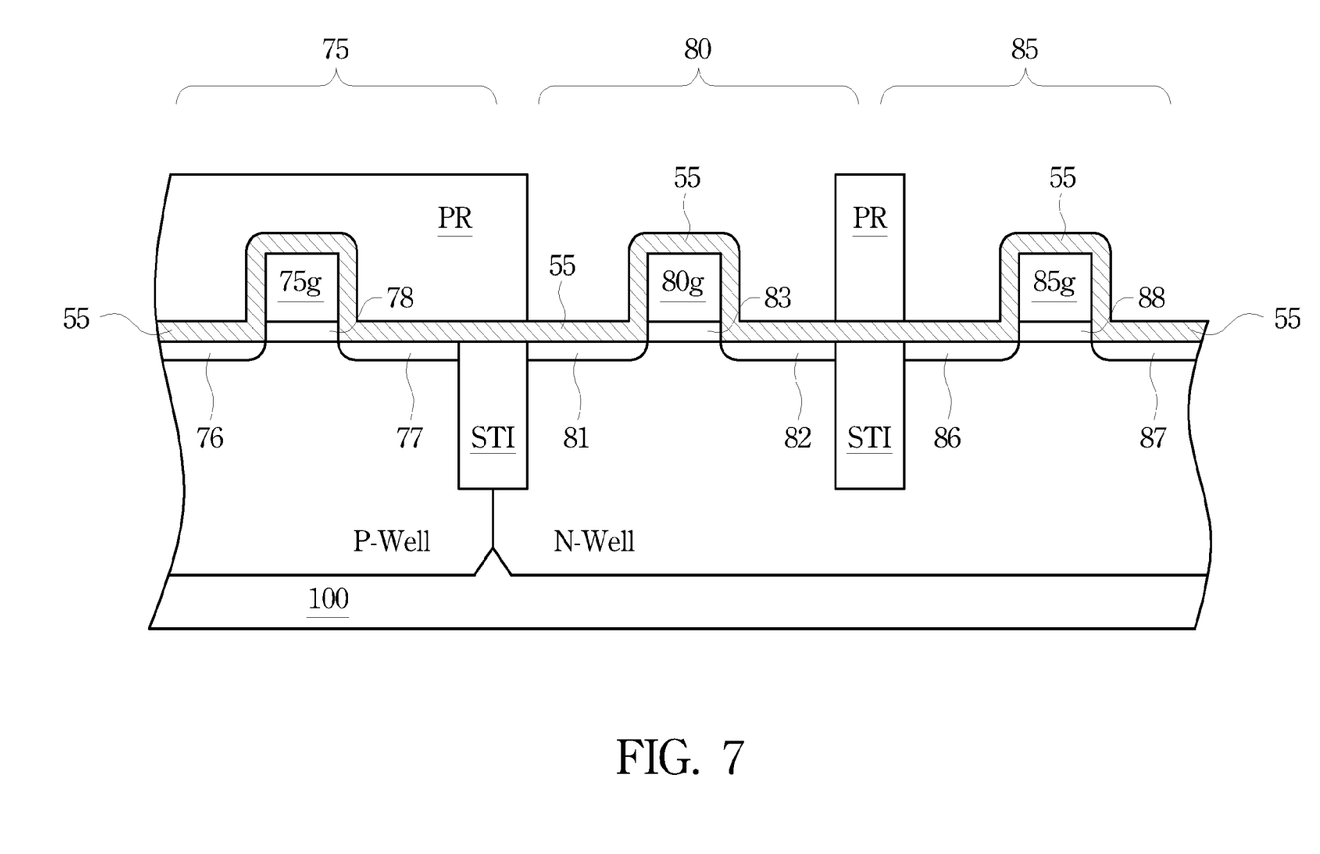

Next, referring to FIG. 7, dielectric layer 55 is formed on the top surface of the substrate. By way of example, silicon nitride ($Si_3N_4$ or $Si_xN_y$), oxide, and/or silicon oxynitride ($Si_x$-$ON_y$) may be used for dielectric layer 55, although other suitable dielectric materials are not excluded. These materials may be grown or blanket deposited in any suitable manners, such as by chemical vapor deposition (CVD), plasma enhanced CVD or physical vapor deposition (PVD). In one preferred embodiment, dielectric layer 55 is conformal to the underlying substrate topography. A first photolithography process is applied to the surface of dielectric layer 55, which comprises forming photoresist pattern (PR) for selective etching of dielectric layer 55 on the regions of PMOS transistors 80 and 85.

Figure 8:
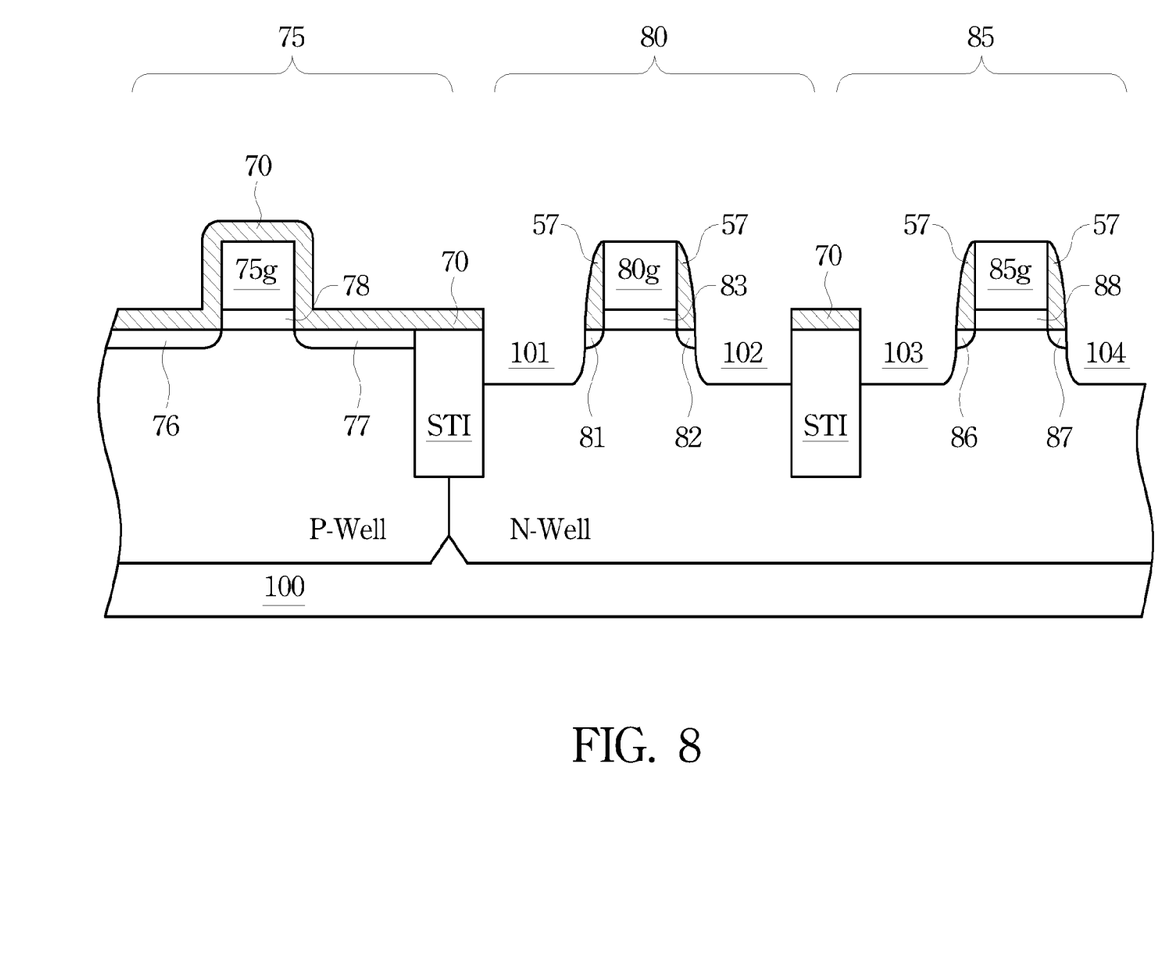

Continuing in FIG. 8, a first suitable etch process, such as a plasma anisotropic etch process, is performed, which removes dielectric layer 55 in the regions of PMOS transistors 80 and 85, leaving dummy spacers 57 at the sidewalls of gate electrode 80g and 85g, and dielectric layer 70 over NMOS transistor 75 and STIs. Recesses 101, 102, 103, and 104 are subsequently formed in substrate 100 at the source/drain regions of PMOS transistors 80 and 85 by a second suitable etch process, such as a plasma anisotropic etch process. In one preferred embodiment, the depth of recesses 101, 102, 103, and 104 measured from the top surface of substrate 100 may be from about 500 Å to about 2000 Å.

Figure 9:
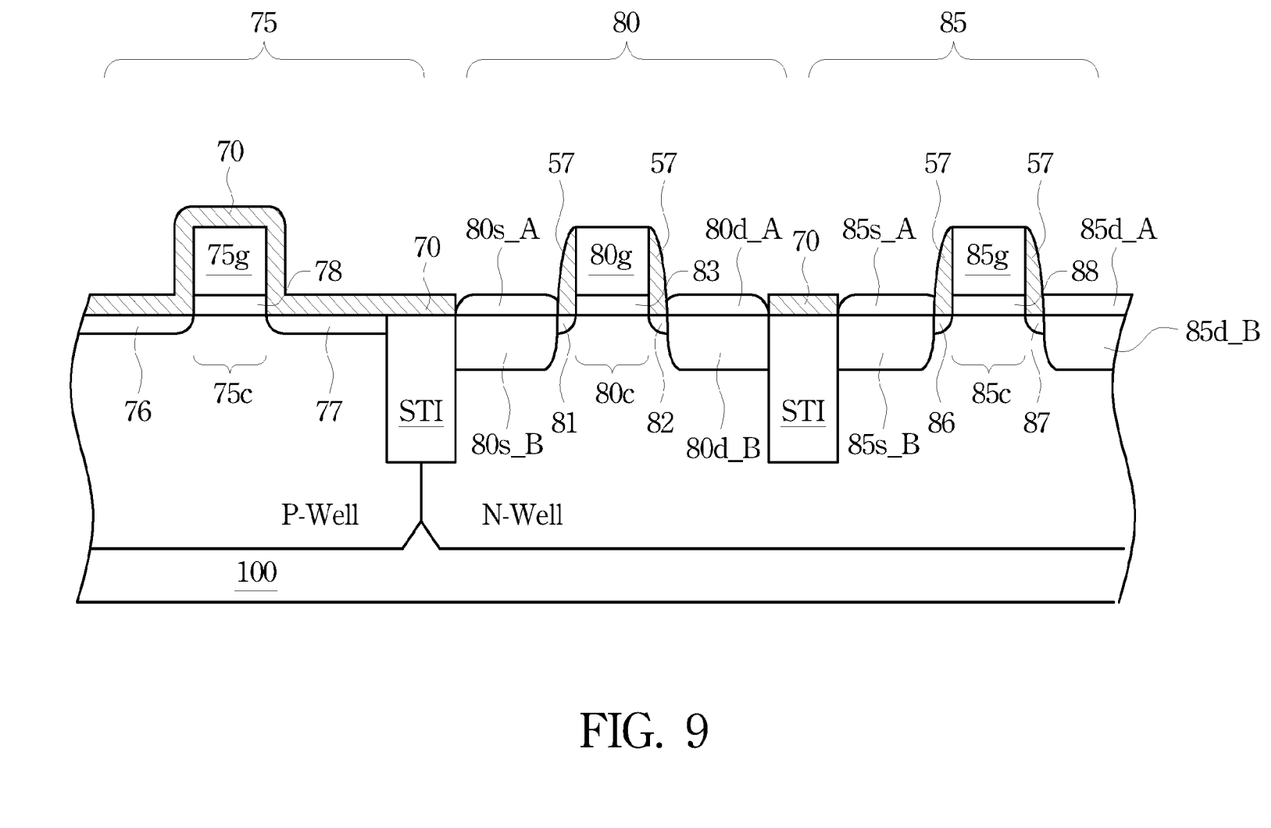

Next, as shown in FIG. 9, strain inducing materials are filled in recesses 101, 102, 103, and 104 to a level above the top surface of substrate 100. By way of example, a first epitaxial SiGe layer is grown in recesses 101, 102, 103, and 104, forming SiGe bottom layers 80s_B and 80d_B of the source/drain regions of PMOS transistor 80, and SiGe bottom layers 85s_B and 85d_B of the source/drain regions of PMOS transistor 85, respectively. The SiGe epitaxy process may be performed based using a gas phase $DCS/GeH_4/HCl/H_2$ CVD at a reduced pressure of about 5-50 Torr and at a temperature of about 500-1000° C. The higher the $GeH_4$ ratio, the higher the Ge concentration in the SiGe bottom layers, the more pronounced the strain effect on hole mobility. In one preferred embodiment, the SiGe bottom layers have a Ge concentration of about 20%, thus, creating a desired compressive strain in channel region 80c of PMOS transistor 80 and channel region 85c of PMOS transistor 85, respectively.

Remaining in FIG. 9, a second epitaxial SiGe layer is selectively grown on the top surfaces of SiGe bottom layers 80s_B and 80d_B of the source/drain regions of PMOS transistor 80, and SiGe bottom layers 85s_B and 85d_B of the source/drain regions of PMOS transistor 85, forming SiGe cap layers 80s_A and 80d_A of the source/drain regions of PMOS transistor 80 and SiGe cap layers 85s_A and 85d_A of the source/drain regions of PMOS transistor 85. The second SiGe epitaxy layer is made by SiGe epitaxy process having similar process parameters to those used to form the first SiGe epitaxy layer, but with a lower Ge concentration from about 0% to about 20%. The lower Ge concentration in cap layers 80s_A and 80d_A, and 85s_A and 85d_A provides a substantially matching lattice constant between SiGe on the top surfaces of the SiGe source/drain regions of PMOS 80 and PMOS 85, and the silicide layer formed from there on in a later process step, thus, facilitating a substantially defect-free silicide-to-source/drain interface. This, in turn, results in a reduced resistance of a wire contact to the source/drain regions of PMOS transistors 80 and 85.

In one preferred embodiment, the thickness of the first epitaxial SiGe layer is about 500 to about 2500 Å, and thickness of the second epitaxial SiGe layer is about 50 Å to about 300 Å. Dielectric layer 70 formed over the STI regions in an earlier process step blocks the lateral extension of SiGe epitaxial layer during the epitaxial process of forming SiGe source/drain layers of PMOS transistors 80 and 85.

Figure 10:
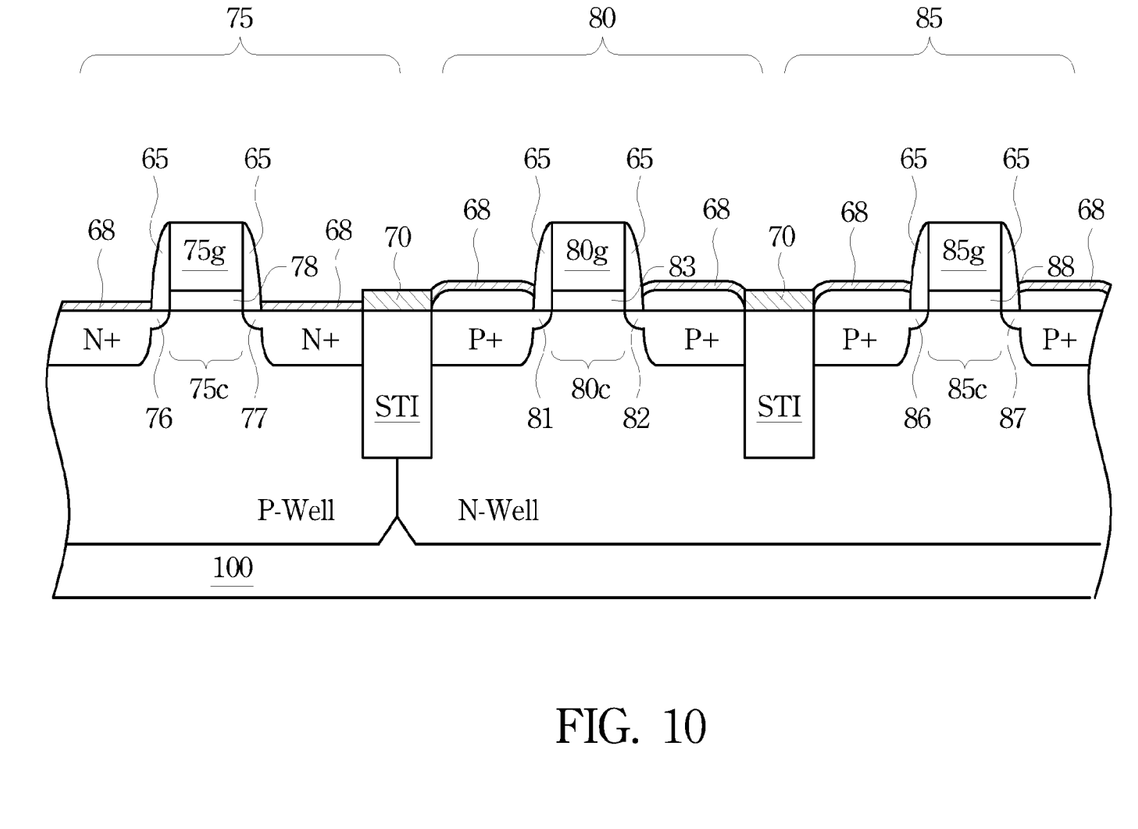

Continuing in FIG. 10, dummy spacers 57 at the sidewalls of the gate electrode 80g and 85g, and dielectric layer 70 over the NMOS transistor regions, are removed. Gate electrode spacer 65 is formed by suitable materials on the sidewalls of NMOS transistor 75 and PMOS transistors 80 and 85. Source/drain regions of NMOS transistor and PMOS transistors 80 and 85 are doped by suitable processes, such as a diffusion and/or implantation process, to form heavily-doped source/drain regions. A silicide layer 68 is preferably formed atop the source/drain regions and gate electrodes (not shown) of the NMOS and PMOS transistors in order to reduce the resistance of the NMOS and PMOS source/drain regions and the gate electrodes. The silicide is preferably $NiSi_2$, $CoSi_2$, $WSi_2$, $TiSi_2$ or the like.

Optionally, a tensile-stressed film (not shown) may be formed on the gate regions and at least a portion of the source regions and drain regions of the NMOS transistors, such as 75g, 75s and 75d of NMOS transistor 75. Such a tensile-stressed film may be formed of a dielectric material, such as silicon nitride, oxynitride, and oxide, in order to create a tensile strain in channel regions of the NMOS transistors in an SRAM cell, such as 75c of NMOS transistor 75. Thus, the upgraded drive current of NMOS transistors in an SRAM cell can be used to enhance the NMOS transistor performance, reduce the size of an SRAM cell, retain a pre-determined SRAM cell static noise margin (SNM), among others, as explained above.

After the completion of the current process step, CMOS manufacturing processes can continue from this point by, for example, depositing a first inter-layer dielectric layer (ILD) on the substrate and cutting contact openings through the ILD where contacts to source/drain regions and gate electrodes of the NMOS and PMOS transistors are needed. Metal deposition processes may be used to fill conductive contact materials, such as tungsten, in the contact openings. Then, planarization processes such as a chemical mechanical polishing (CMP) process may be applied on the substrate surface to remove the excess tungsten formation on the substrate surface, providing a substantially flat substrate surface preferable for the subsequent processing steps.

Embodiments provide a semiconductor device comprising an insulating layer disposed on an STI that isolates adjacent MOS devices. The insulation layer is substantially elevated from the semiconductor substrate surface. The elevated insulation layer facilitates the formation of desirable thick epitaxial source/drain regions, and prevents the lateral extension of the source/drain epitaxial layers. The inventive device structure may lead to improved MOS transistor performance, improved SRAM memory cell performance, and improved overall SRAM product manufacturing yield.

In accordance with a preferred embodiment of the present invention, a semiconductor device comprises a semiconductor substrate having a top surface, the substrate being formed of a first semiconductor material having a first lattice constant. The semiconductor device also comprises a first and a second recess that are formed in the substrate and are both filled with a second semiconductor material. The second semiconductor material has a second lattice constant that is different from that of the first semiconductor material. Also, the second semiconductor material is elevated from the top surface of the semiconductor substrate. The semiconductor device further comprises an isolation region disposed between the first recess and the second recess, the isolation region having a first insulating layer and a second insulating layer, the first insulating layer extending into the substrate and, the second insulating layer being on the first insulating layer and extending above the top surface.

In accordance with another preferred embodiment of the present invention, a semiconductor device comprises a semiconductor substrate of a first semiconductor material having a first lattice constant, the semiconductor substrate having a top surface. The semiconductor device also comprises a gate electrode on the semiconductor substrate. The semiconductor device also comprises a first isolation region disposed in the semiconductor substrate, the first isolation region having a first insulation layer extending into the semiconductor substrate and a second insulation layer disposed atop the first insulation layer, the second insulation layer being elevated above the top surface. The semiconductor device also comprises a second isolation region disposed in the semiconductor substrate, the second isolation region having a third insulation layer extending into the semiconductor substrate and a fourth insulation layer disposed atop the third insulation portion, the fourth insulation layer being elevated above the top surface. The semiconductor device further comprises a first active region disposed between the gate electrode and the first isolation region, the first active region comprising a first portion extending into the semiconductor substrate and a second portion elevated above the top surface. The semiconductor device further comprises a second active region disposed between the gate electrode and the second isolation region, the second active region comprising a third portion extending into the semiconductor substrate and a fourth portion elevated above the top surface. The first and the second active region each comprises a second semiconductor material that has a second lattice constant different from the first lattice constant of the first semiconductor material.

Although the present invention and its advantages have been described in detail, it should be understood that various changes, substitutions and alterations can be made herein without departing from the spirit and scope of the invention as defined by the appended claims. Also, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a first insulating layer in a top surface of a substrate, the first insulating layer being between a first portion and a second portion of the substrate and having a top surface substantially coplanar with the top surface of the substrate, the substrate being formed of a first semiconductor material;
    forming a dielectric layer over the first and second portions of the substrate and the first insulating layer;
    removing the dielectric layer from over the first and second portions of the substrate to form a second insulating layer on the top surface of the first insulating layer, the top surface of the second insulating layer extending above the top surface of the substrate;
    forming a first region in the top surface of the first portion of the substrate, the first region comprising a second semiconductor material, the second semiconductor material having a different material composition than the first semiconductor material; and
    forming a second region in the top surface of the second portion of the substrate, the second region comprising the second semiconductor material.

2. The method of claim 1, wherein the first region is a source/drain region of a first MOS transistor, the second region being a source/drain region of a second MOS transistor.

3. The method of claim 2, wherein the first MOS transistor and the second MOS transistor is each a PMOS transistor, the second semiconductor material having a lattice constant greater than that of the first semiconductor material.

4. The method of claim 1, wherein the first semiconductor material comprises silicon (Si), and wherein the second semiconductor material comprises silicon germanium (SiGe).

5. The method of claim 1, wherein the forming the first region comprises:
    forming a first recess in the first portion of the substrate;
    forming a bottom layer in first recess; and
    forming a cap layer on the bottom layer.

6. The method of claim 5, wherein the cap layer comprises SiGe having a first germanium (Ge) concentration, the bottom layer comprises SiGe having a second Ge concentration, the second Ge concentration being greater than the first Ge concentration.

7. The method of claim 1, wherein the forming the dielectric layer over the first and second portions of the substrate and the first insulating layer comprises conformally depositing the dielectric layer over the first and second portions of the substrate and the first insulating layer to have a substantially uniform thickness.

8. The method of claim 1, wherein the second insulating layer comprises one of silicon nitride ($Si_xN_y$), silicon oxynitride ($Si_xON_y$), silicon oxide, silicon carbon (SiC), silicon carbon nitride (SiCN), or a combination thereof.

9. The method of claim 1, wherein a first edge of the first insulating layer is substantially aligned with a first edge of the second insulating layer, and wherein a second edge of the first insulating layer is substantially aligned with a second edge of the second insulating layer.

10. The method of claim 1, wherein the first insulating layer and the second insulating layer comprise different materials.

11. A method of forming a semiconductor device, the method comprising:
  forming a gate electrode on a semiconductor substrate, the semiconductor substrate being formed of a first semiconductor material;
  forming a first insulation layer extending into the semiconductor substrate;
  forming a second insulation layer extending into the semiconductor substrate;
  forming a dielectric layer over the gate electrode, the first insulation layer, the second insulation layer, and a top surface of the semiconductor substrate;
  patterning the dielectric layer to form a first set of spacers on sidewalls of the gate electrode and to form a third insulation layer on the first insulation layer and a fourth insulation layer on the second insulation layer, the first insulation layer and the third insulation layer forming a first isolation region, the second insulation layer and the fourth insulation layer forming a second isolation region;
  forming a first active region between the gate electrode and the first isolation region, the first active region comprising a first portion extending into the semiconductor substrate and a second portion elevated above the top surface; and
  forming a second active region disposed between the gate electrode and the second isolation region, the second active region comprising a third portion extending into the semiconductor substrate and a fourth portion elevated above the top surface, the first and the second active regions each comprising a second semiconductor material different from the first semiconductor material.

12. The method of claim 11, wherein the forming the dielectric layer over the gate electrode, the first insulation layer, the second insulation layer, and the top surface of the semiconductor substrate comprises conformally depositing the dielectric layer over the gate electrode, the first insulation layer, the second insulation layer, and the top surface of the semiconductor substrate, the dielectric layer having a substantially uniform thickness on sidewalls and a top surface of the gate electrode and top surfaces of the first insulation layer, the second insulation layer, and the semiconductor substrate.

13. The method of claim 11, wherein the first semiconductor material comprises silicon (Si), and wherein the second semiconductor material comprises silicon Germanium (SiGe).

14. The method of claim 11 wherein the first and the second active region is a source region and a drain region of a PMOS transistor, respectively.

15. The method of claim 11, wherein the first insulation layer of the first isolation region and the second insulation layer of the second isolation region are shallow trench isolations (STI).

16. The method of claim 11 wherein a top surface of the third insulation layer of the first isolation region is substantially coplanar with a top surface of the second portion of the first active region, and wherein a top surface of the fourth insulation layer of the second isolation region is substantially coplanar with a top surface of the fourth portion of the second active region.

17. The method of claim 11 further comprising forming a silicide layer atop the gate electrode and the first and the second active regions.

18. A method of forming a semiconductor device, the method comprising:
  forming an n-well region and a p-well region in a substrate;
  forming a shallow trench isolation (STI) region between the n-well region and the p-well region;
  forming a first gate electrode over the n-well region and a second gate electrode over the p-well region;
  forming a dielectric layer over the first and second gate electrodes, the STI region, and top surfaces of the n-well and the p-well regions;
  removing the dielectric layer from the n-well region to form a first set of spacers on the first gate electrode;
  forming a first active region between the first gate electrode and the STI region;
  removing the dielectric layer from the p-well region to form a second set of spacers on the second gate electrode and an insulation layer on the STI region; and
  forming a second active region between the second gate electrode and the STI region, the first active region having a top surface extending above a top surface of the second active region.

19. The method of claim 18 further comprising:
  replacing the first set of spacers with a third set of spacers; and
  replacing the second set of spacers with fourth set of spacers.

20. The method of claim 18, wherein the first active region comprises a source/drain region of a PMOS transistor and the second active region comprises a source/drain region of an NMOS transistor.

* * * * *